United States Patent
Zele et al.

(10) Patent No.: US 9,154,154 B2
(45) Date of Patent: Oct. 6, 2015

(54) METHOD AND SYSTEM FOR A LOW INPUT VOLTAGE LOW IMPEDANCE TERMINATION STAGE FOR CURRENT INPUTS

(71) Applicant: Maxlinear, Inc., Carlsbad, CA (US)

(72) Inventors: Rajesh Zele, Carsbad, CA (US); Gaurav Chandra, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 14/471,587

(22) Filed: Aug. 28, 2014

(65) Prior Publication Data

US 2015/0061910 A1  Mar. 5, 2015

Related U.S. Application Data

(60) Provisional application No. 61/870,889, filed on Aug. 28, 2013.

(51) Int. Cl.
  *H03M 1/66* (2006.01)
  *H03M 1/70* (2006.01)
(52) U.S. Cl.
  CPC ........................................ *H03M 1/70* (2013.01)
(58) Field of Classification Search
  CPC .................................. H03M 1/70; H04N 5/52
  USPC .......................................... 341/144, 145, 136
  See application file for complete search history.

(56) References Cited

U.S. PATENT DOCUMENTS

| | | | | |
|---|---|---|---|---|
| 7,834,791 | B2* | 11/2010 | Huang et al. | 341/144 |
| 2002/0044076 | A1* | 4/2002 | Yao et al. | 341/136 |
| 2007/0120602 | A1* | 5/2007 | Kuroda | 330/254 |
| 2011/0025655 | A1* | 2/2011 | Nishimura et al. | 345/204 |

* cited by examiner

*Primary Examiner* — Jean B Jeanglaude
(74) *Attorney, Agent, or Firm* — McAndrews, Held & Malloy (57) ABSTRACT

Methods and systems for a low input voltage low impedance termination stage for current inputs may include, in a semiconductor die, generating an output current proportional to an input signal, where the output current is generated by an output stage that may include a pair of input cascode transistors and at least one pair of stacked output transistors. A source-follower feedback path for the input cascode transistors may include a feedback transistor with its gate terminal coupled to a drain terminal of a first of the input cascode transistors, a drain of the feedback transistor coupled to a supply voltage, and a source terminal of the feedback transistor coupled to a current source that is coupled to ground. A current source may be coupled to the drain of the first of the input cascode transistors. The supply voltage may be coupled to the stacked output transistors via a load resistor.

22 Claims, 5 Drawing Sheets

METHOD AND SYSTEM FOR A LOW INPUT VOLTAGE LOW IMPEDANCE TERMINATION STAGE FOR CURRENT INPUTS

CROSS-REFERENCE TO RELATED APPLICATIONS/INCORPORATION BY REFERENCE

This application makes reference to and claims priority to U.S. Provisional Application Ser. No. 61/870,889 filed on Aug. 28, 2013. The above identified application is hereby incorporated herein by reference in its entirety.

FIELD

Certain embodiments of the invention relate to semiconductor devices. More specifically, certain embodiments of the invention relate to a method and system for a low input voltage low impedance termination stage for current inputs.

BACKGROUND

Complementary metal oxide semiconductor (CMOS) transistors are ubiquitous in today's electronics devices. As CMOS trends continue to scale down the device feature size, handling high voltage/power levels becomes very challenging.

Further limitations and disadvantages of conventional and traditional approaches will become apparent to one of skill in the art, through comparison of such systems with the present invention as set forth in the remainder of the present application with reference to the drawings.

BRIEF SUMMARY

A system and/or method for a low input voltage low impedance termination stage for current inputs substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION

Certain aspects of the disclosure may be found in low input voltage low impedance termination stage for current inputs. Exemplary aspects of the invention may comprise an output stage for an electrical circuit, the output stage comprising a pair of input cascode transistors and at least one pair of stacked output transistors. A source-follower feedback path for the input cascode transistors may comprise a feedback transistor with its gate terminal coupled to a drain terminal of a first of the input cascode transistors, a drain of the feedback transistor coupled to a supply voltage, and a source terminal of the feedback transistor coupled to a current source that is coupled to ground. A current source may be coupled to the drain of the first of the input cascode transistors. The supply voltage may be coupled to the at least one pair of stacked output transistors via a load resistor. The input cascode transistors, the feedback transistor, and the at least one pair of stacked output transistors may comprise complementary metal-oxide semiconductor (CMOS) transistors. A current through the input cascode transistors may be controlled by a bias voltage applied to a gate terminal of the first of the input cascode transistors. The electrical circuit may comprise a power amplifier. The power amplifier may comprise a differential gain stage coupled to a source terminal of the first of the cascode transistors and a drain of a second of the cascode transistors. The electrical circuit may comprise a digital-to-analog converter (DAC) that may comprise a plurality of unit cells, each cell coupled to a source terminal of the first of the cascode transistors and a drain of a second of the cascode transistors. Each of the plurality of unit cells may also be coupled to cascode transistors in a second output stage nominally identical to the output stage. A feedback circuit comprising a resistor and a capacitor in series may be coupled from the pair of input cascode transistors to a load resistance that is coupled to the at least one pair of stacked output transistors.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
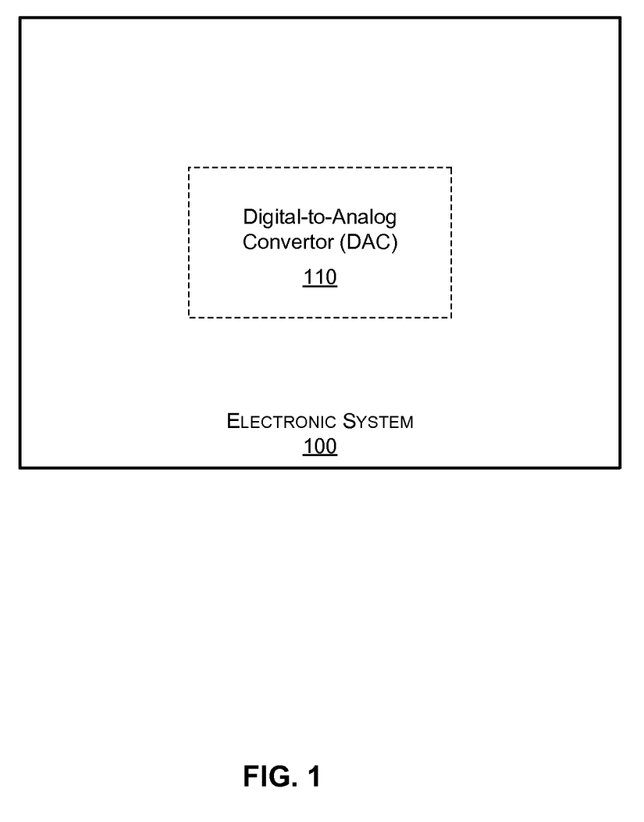
FIG. 1 illustrates an example electronic system that may be operable to perform digital-to-analog conversions, in accordance with an example embodiment of the disclosure.

FIG. 1 illustrates an example electronic system that may be operable to perform digital-to-analog conversions, in accordance with an example embodiment of the disclosure. Referring to FIG. 1, there is shown electronic system 100.

The electronic system 100 may comprise suitable circuitry, interfaces, logic and/or code for implementing various aspects of the present disclosure. In this regard, the electronic system 100 may be configured to support performing, executing or running various operations, functions, applications and/or services. For example, the electronic system 100 may be used for executing computer programs, playing video and/or or audio content, gaming, communication applications or services (e.g., Internet access and/or browsing, email, text messaging, chatting and/or voice calling services), and/or networking services (e.g., WiFi hotspot, Bluetooth piconet, Ethernet networking, cable or satellite systems, and/or active 4G/3G/femtocell data channels).

In some instances, the electronic system 100 may be configured to enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols.

Examples of wireless protocols or standards that may be supported and/or used by the electronic system 100 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the electronic system 100 comprise Ethernet (IEEE 802.2), Fiber Distributed Data Interface (FDDI), Integrated Services Digital Network (ISDN), cable television and/or internet (ATSC, DVB-C, DOCSIS), and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow user interactions that may be needed for controlling services provided by the electronic system 100 (e.g., to allow operators to provide input or commands for controlling location specific marketing, or obtain output or feedback pertaining to it). In this regard, the electronic system 100 may comprise components or subsystems for enabling interactions with a user (e.g., end-user or installer), so as to obtain user input and/or to provide user output.

The electronic system 100 may be a stationary system (i.e., being installed at, and/or configured for use only in particular location). In other instances, however, the electronic system 100 may be a mobile device—i.e., intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), personal computers (e.g., laptops or desktops), servers, dedicated multimedia devices (e.g., televisions, game consoles, or portable media players), set-top boxes (STBs) or other similar receiver systems, and the like. The disclosure, however, is not limited to any particular type of electronic system.

In operation, the electronic system 100 may be operable to perform various operations, functions, applications and/or services. For example, in some instances, electronic system 100 may be configured or used to communicate data (to and/or from the system), and to process the communicated data. In this regard, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme. Accordingly, handling of digital communications (e.g., in the electronic system 100) may typically require performing, inter alia, digital-to-analog conversions at the transmitting end and analog-to-digital conversions at the receiving end.

For example, the electronic device may comprise one or more digital-to-analog converters (DACs) 110. In this regard, each DAC 110 may comprise circuitry, interfaces, logic and/or code for performing digital-to-analog conversions.

In this regard, each DAC 110 may comprise suitable circuitry, interfaces, logic, and/or code for performing digital-to-analog conversions. The DAC 110 may be utilized, for example, during signal processing, such as to allow converting digital data into analog waveforms that may be embedded into transmitted radio frequency (RF) signals. The disclosure, however, is not limited to any particular use scenario, and may be utilized in any appropriate setup performing or requiring digital-to-analog conversions.

Various architectures and/or designs may be used in implementing digital-to-analog converters (DACs). For example, DACs may be implemented based on current-steering. In this regard, in current-steering DACs, the conversion from digital to analog may be performed based on steering of current from sources, with the steering being controlled or adjusted based on the input digital code.

There may be certain issues and/or disadvantages with use of current-steering DACs, however. For example, typically current-steering DACs may be terminated in a diode connected transistor when further amplification is desired. Current flowing through the diode connected transistor may be then mirrored and scaled up for amplification. The disadvantage of such termination is that it may reduce the voltage drop across the current-steering DAC stage giving rise to various DAC non-idealities. Also the signal voltage swing due to signal current flowing in the diode connected transistor may give rise to the undesirable signal dependent DAC switching operation. Another issue with the diode connected termination is achieving large current gain. When high current gain is desired, the current mirror bandwidth may suffer due to large capacitive loading at the diode connected termination. Accordingly, in various implementations in accordance with the present disclosure, the problems described above may be solved and/or remedied. For example, these problems may be addressed with an introduction of low input impedance termination stage. An example implementation incorporating a low input impedance termination stage is described in more detail with respect to FIG. 2.

Figure 2:
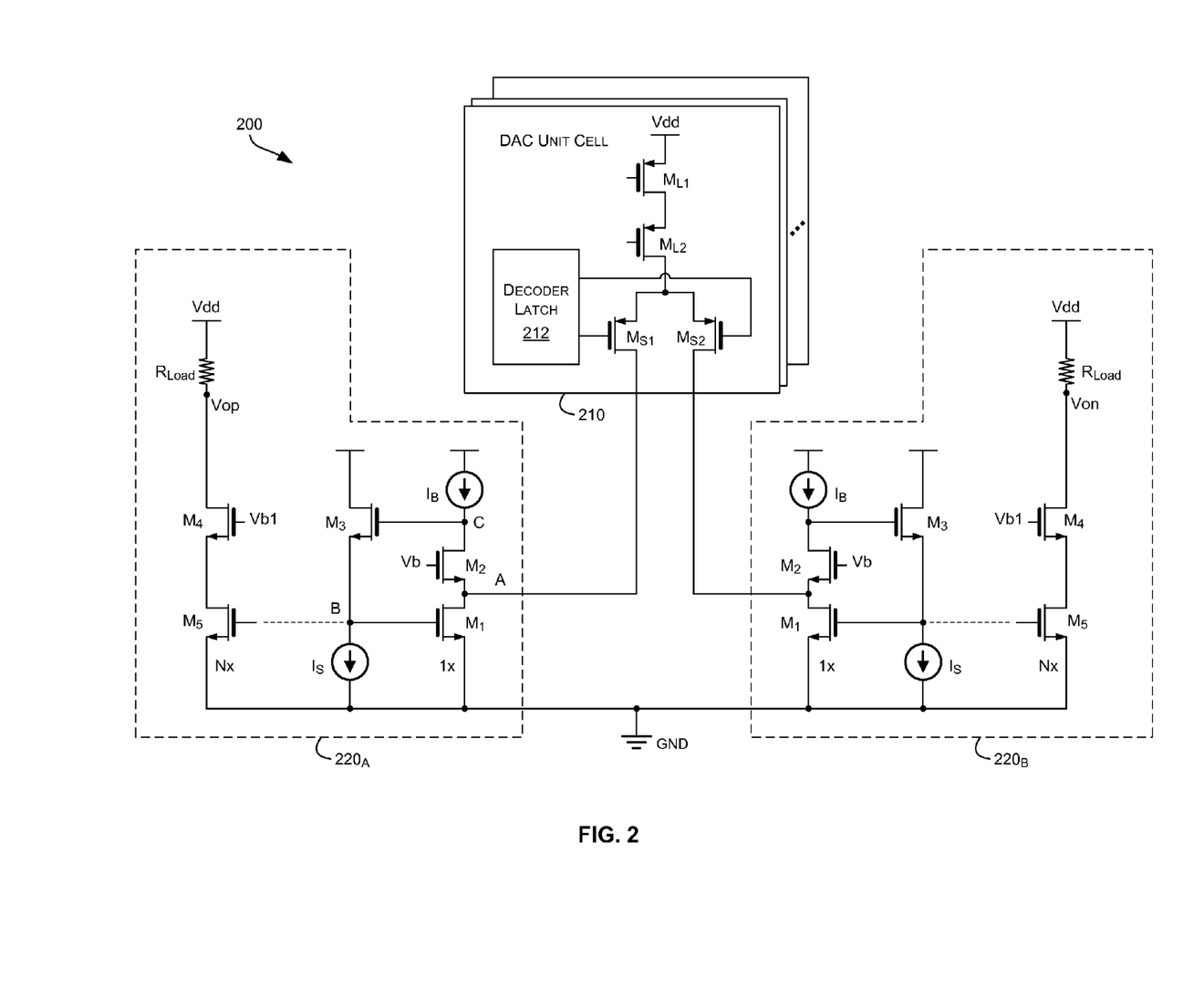
FIG. 2 illustrates an example current-steering based digital-to-analog convertor (DAC) architecture with low input voltage low impedance termination stage for current input, in accordance with an example embodiment of the disclosure.

FIG. 2 an example current-steering based digital-to-analog convertor (DAC) architecture with low input voltage low impedance termination stage for current input, in accordance with an example embodiment of the disclosure. Referring to FIG. 2, there is shown a digital-to-analog convertor (DAC) 200.

The DAC 200 may comprise suitable circuitry, interfaces, logic, and/or code for performing digital-to-analog conversions. The DAC 200 may be substantially similar to the DAC 100 of FIG. 1. The DAC 200 may be implemented based on current-steering architecture.

In this regard, the DAC 200 may comprise a plurality of DAC unit cells 210 and a pair of termination stage circuits $220_A$ and $220_B$. The termination stage circuits $220_A$ and $220_B$ may be nominally identical, within normal device tolerances, for example. Any number of DAC unit cells may be utilized, depending on die size limitations and the desired bit resolution for the DAC, for example. Each DAC unit cell 210 may comprise a differential load steering circuit and a decoder latch 212. The differential load steering circuit may comprise a plurality of transistors $M_{L1}$ and $M_{L2}$ (e.g., PMOS transistors), which may be configured in differential load manner— e.g., to a supply voltage $V_{dd}$, in a controlled manner, through two switching branches comprising the transistors $M_{S1}$ and $M_{S2}$ (e.g., PMOS transistors).

The decoder latch 212, which may be adapted to generate control signals to the steering circuit based on input code (i.e., the digital code being converted). In this regard, the decode latch 212 may open one branch by enabling $M_{S1}$ or $M_{S2}$ (while closing the other branch) based on the binary input (logic '0' or '1').

The termination stage circuits $220_A$ and $220_B$ may be configured for providing source follower staging. In this regard, use of the termination stage circuits $220_A$ and $220_B$ may enhance performance of the DAC 200, such as by lowering termination impedance and/or lowering CM voltage for DAC output. The use of termination stage circuits $220_A$ and $220_B$ may also allow for use of current sources that may only be a fraction of full scale DAC currents. In the example implementation of the termination stage circuits in the DAC 200, the output of the current-steering DAC may be terminated into the source of cascode transistors (e.g., NMOS) M2 of termination stage circuits $220_A$ and $220_B$. Transistors (e.g., NMOS) M3 with bias current sources $I_S$, form a feedback path for M1, may comprise a source follower stage that buffers the large capacitive loading at node B due to large current scaling ratio.

While NMOS transistors are shown in FIG. 2, the disclosure is not so limited. Accordingly, PMOS transistors may also be utilized in a circuit that may essentially be a mirror image of DAC 200.

For example, with respect to the termination stage circuit $220_A$, the input impedance ($Z_{in}$) into node A may be given by the equation:

$$Z_{in} = \frac{1}{g_{m1}(g_{m2} \cdot r_{o2})} \quad (1)$$

In comparison, for a diode connected transistor termination stage, the input impedance is $1/g_{m1}$. The new termination stage may show a reduction in the input impedance by factor of $g_{m2}*r_{o2}$ (~25). Since the input impedance is reduced by at least an order of magnitude, the signal swing at this node may also be reduced by the same factor.

The DC voltage at node A may be controlled by using bias voltage Vb. In this regard, a minimum voltage at node A may be $V_{dsat1}$, the saturation voltage of transistor M1. This may be an improvement compared to a diode connected transistor stage, which has a voltage drop of $VT+V_{dsat}$, and may result in an additional 500 mV headroom for the current-steering DAC 200 to operate.

The impedance into node B ($Z_B$) may be given by the equation:

$$Z_B = \frac{1}{g_{m3}(g_m \cdot r_o)^2} \quad (2)$$

Compared to a diode connected termination stage, this is an improvement by a factor of $(g_m*r_o)^2$. This may improve the bandwidth for large current mirror scaling ratios. The feedback loop around M1-M3 must generally be stable for correct operation of the termination stage. It can be easily compensated for by using a capacitor across drain and source nodes of transistor M2. Currents $I_B$ and $I_S$ can be a fraction of the full-scale DAC currents, resulting in a small increase in power dissipation compared to a diode connected termination stage.

The resistors $R_{Load}$ in the termination stage circuits $220_A$ and $220_B$ may represent the output load of the current steering DAC 200, as shown by the differential output voltage $V_{op}-V_{on}$. The current $I_B$ may be mirrored by a plurality of stages, as indicated by the dashed line extending from node A, with the stages comprising stacked transistors such as M4 and M5 (e.g., NMOS). Any number of stacked transistors may be utilized to provide a desired number of current steps from the minimum current, through M1, to the maximum current, supplied by the last transistor M5 with a size ratio of N:1 over the transistor M1.

While the termination stage circuits $220_A$ and $220_B$ are shown as termination stages for a DAC in FIG. 2, the disclosure is not so limited. Accordingly, the termination stage circuits $220_A$ and $220_B$ may be used in any application where low output impedance and low voltage is desired or required, such as a power amplifier, for example.

Figure 3:
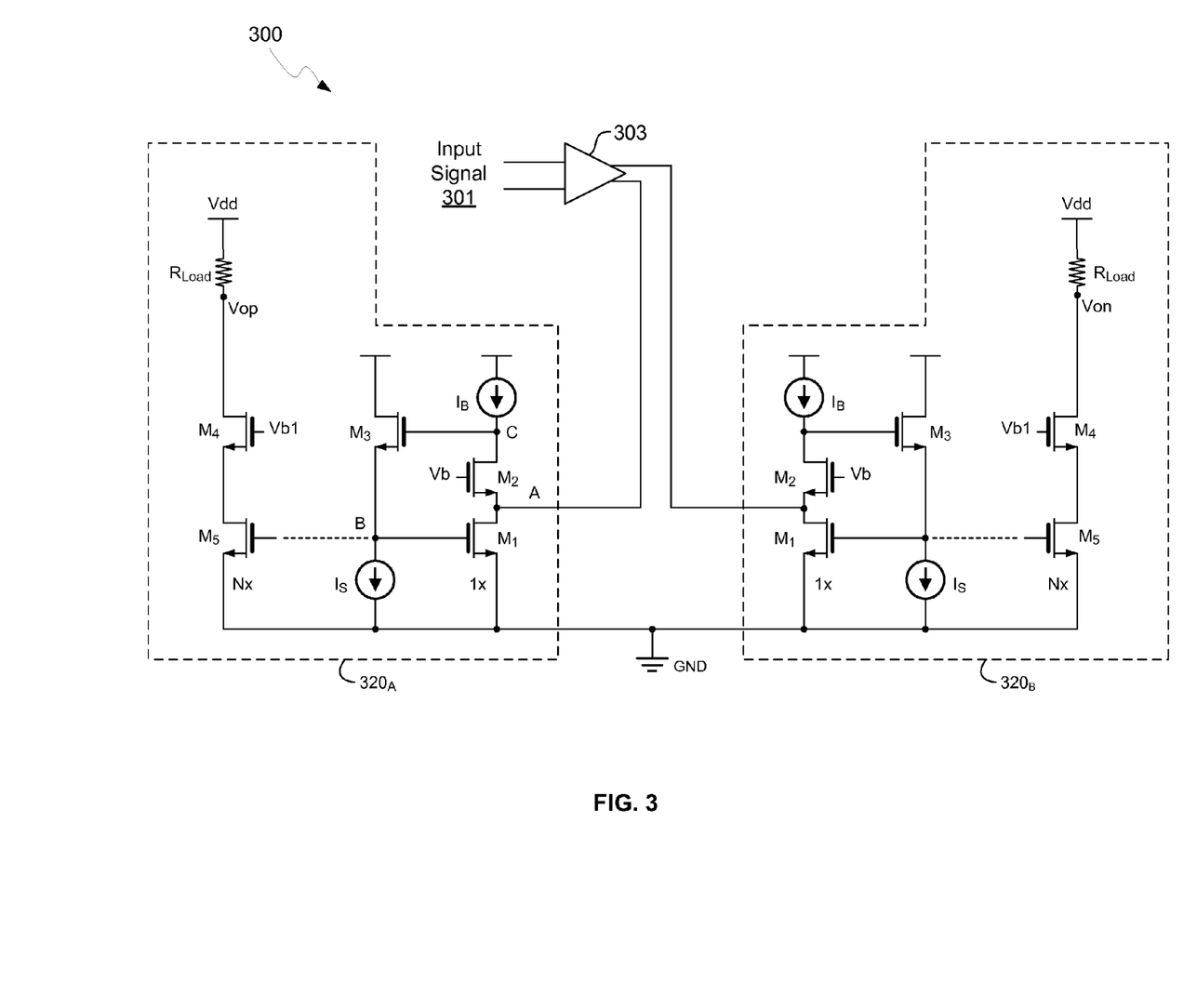
FIG. 3 illustrates an example power amplifier architecture with low input voltage low impedance termination stage for current input, in accordance with an example embodiment of the disclosure.

FIG. 3 an example power amplifier architecture with low input voltage low impedance termination stage for current input, in accordance with an example embodiment of the disclosure. Referring to FIG. 3, there is shown a power amplifier 300. The power amplifier 300 may comprise a gain stage 303 and termination stage circuits 320A and 320B, and may be operable to provide gain to an input signal 301.

The termination stage circuits $320_A$ and $320_B$ may be configured for providing source follower staging. In this regard, use of the termination stage circuits $320_A$ and $320_B$ may enhance performance of the power amplifier 300, such as by lowering termination impedance and/or lowering CM voltage for amplifier output. The use of termination stage circuits $320_A$ and $320_B$ may also allow for use of current sources that may only be a fraction of full scale amplifier currents. In the example implementation of the termination stage circuits in the power amplifier 300, the output of the gain stage 303 may be terminated into the source of cascode transistors (e.g., NMOS) M2 of termination stage circuits $320_A$ and $320_B$. Transistors (e.g., NMOS) M3 with bias current sources $I_S$, form a feedback path for M1, may comprise a source follower stage that buffers the large capacitive loading at node B due to large current scaling ratio.

The resistors $R_{Load}$ in the termination stage circuits $320_A$ and $320_B$ may represent the output load of the power amplifier 300, as shown by the differential output voltage $V_{op}-V_{on}$. The current $I_B$ may be mirrored by a plurality of stages, as indicated by the dashed line extending from node A, with the stages comprising stacked transistors such as M4 and M5 (e.g., NMOS). Any number of stacked transistors may be utilized to provide a desired number of current steps from the minimum current, through M1, to the maximum current, supplied by the last transistor M5 with a size ratio of N:1 over the transistor M1.

It should again be noted that while NMOS transistors are shown in FIG. 3, the disclosure is not so limited. Accordingly, PMOS transistors may also be utilized in a circuit that may essentially be a mirror image of power amplifier 300.

Figure 4:
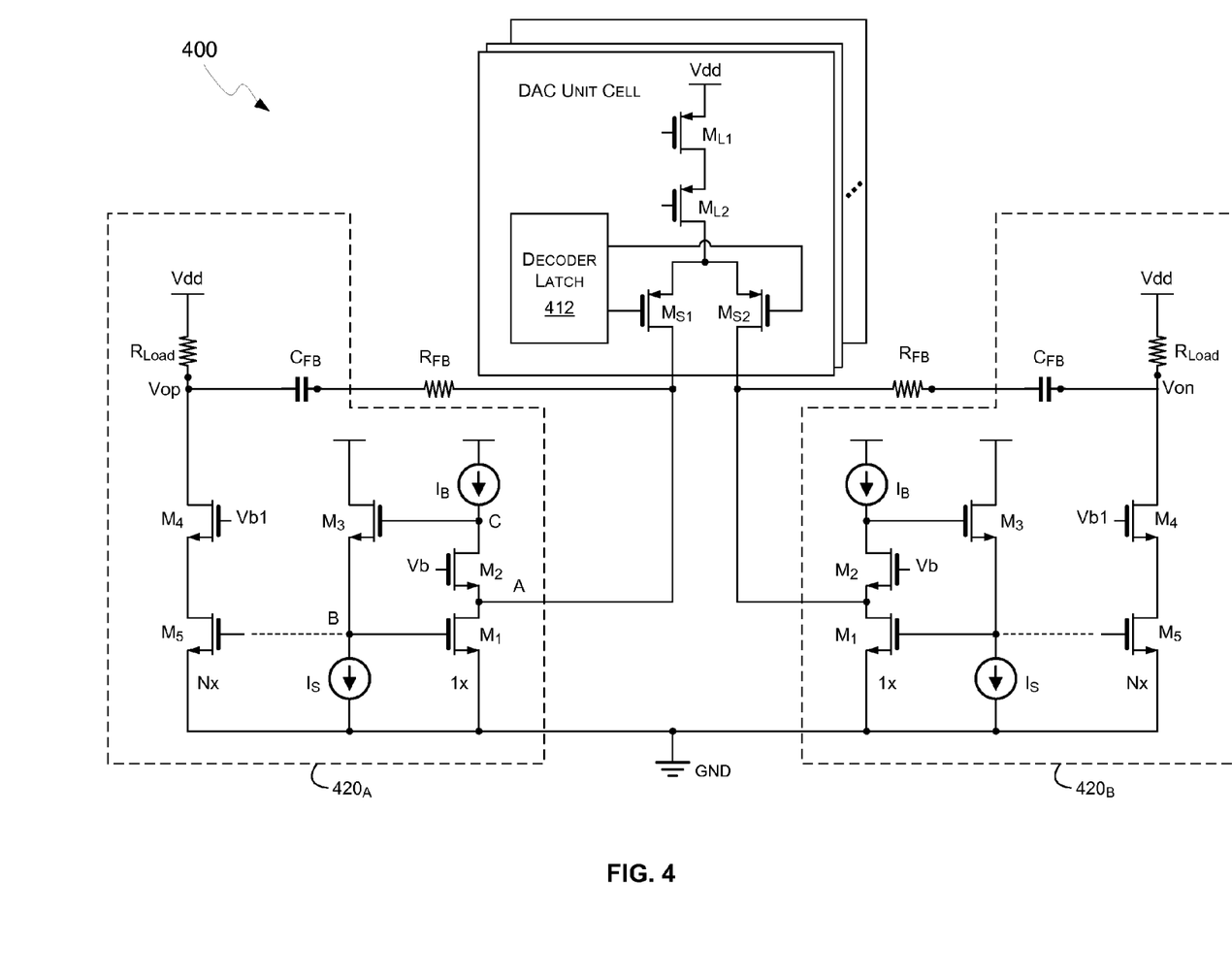
FIG. 4 illustrates an example current-steering based digital-to-analog convertor (DAC) architecture having a low input voltage and low impedance termination stage with impedance matching, in accordance with an example embodiment of the disclosure.

FIG. 4 illustrates an example current-steering based digital-to-analog convertor (DAC) architecture having a low input voltage and low impedance termination stage with impedance matching, in accordance with an example embodiment of the disclosure. In many configurations, the termination circuit may need to provide a well-defined impedance to be matched to an external load. In such applications, the value of the output load impedance $R_{Load}$ in the termination stage circuits $220_A$ and $220_B$, or circuits $320_A$ and $320_B$ may be determined by these constraints. In many configurations, this impedance is very small such as, for example, of the order of 50 or 75 ohms. With such low values of output impedance, to meet a certain voltage swing, the output stage current would need to be increased, leading to high power consumption.

This larger current requirement may be mitigated by the introduction of a feedback resistor capacitor network connecting the termination stage circuits $420_A$ and $420_B$ to the plurality of DAC unit cells 410, using the resistor $R_{FB}$ and the capacitor $C_{FB}$. The capacitor $C_{FB}$ may be used for AC coupling.

It can be shown mathematically that in such a configuration, the output impedance provided by the termination stage circuits $420_A$ and $420_B$ may be given by:

$$Z_{BOUT} = R_{LOAD} \| \frac{R_{FB}}{N+1}$$

Where "$\|$" denotes the "parallel" configuration, indicating two resistors in parallel. In this circuit, the value of resistor $R_{FB}$ and $R_{LOAD}$ may be increased to a large value, as long as a large value of N is used in the circuit, while still meeting the output impedance matching requirement. Under a matched condition, RLOAD=RFB/(N+1). Since an additional parallel RLOAD resistor is not required for matching, the DC current consumed by the output stage may be reduced by half, which leads to considerably lower power consumption.

Figure 5:
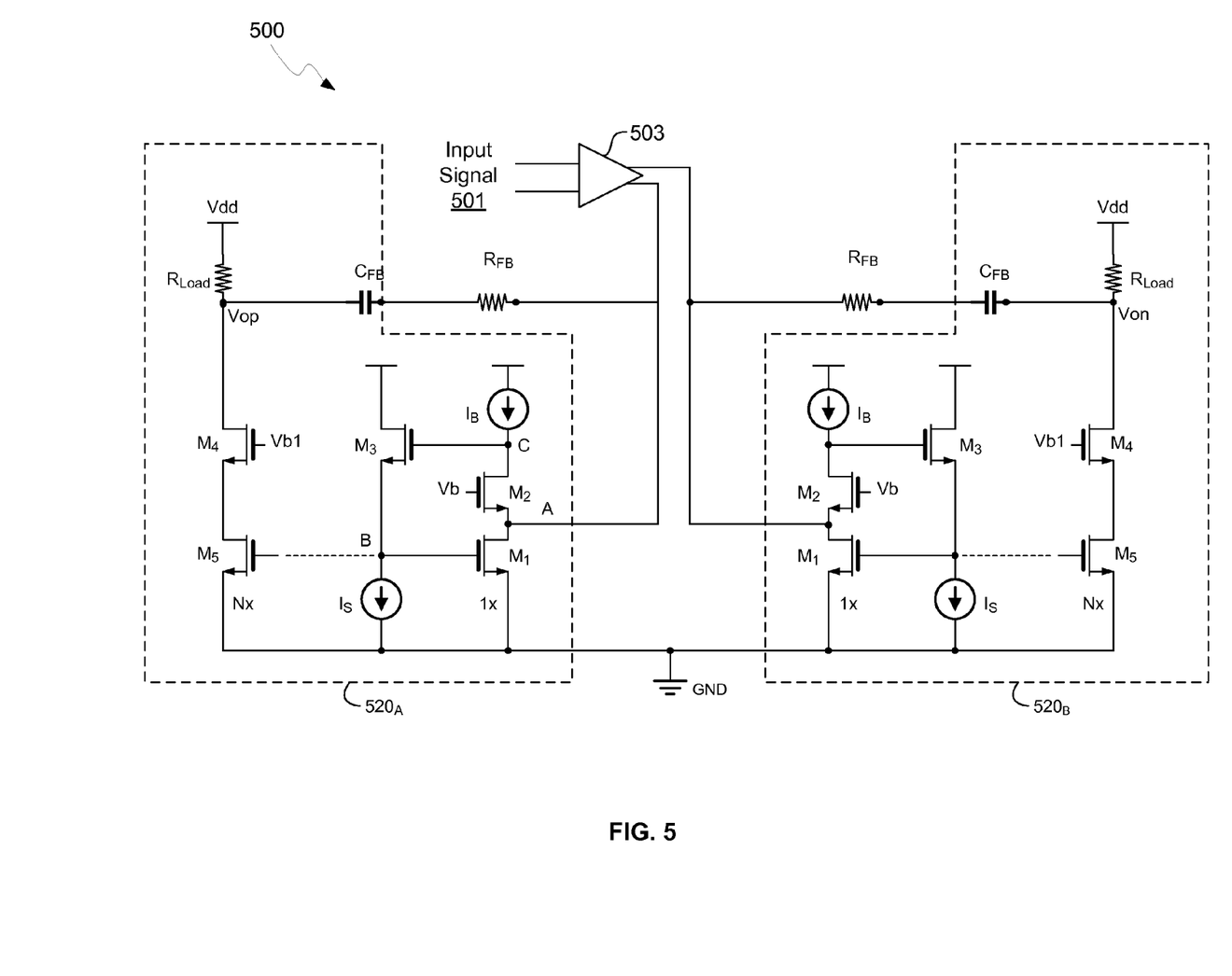
FIG. 5 illustrates an example power amplifier architecture having a low input voltage and low impedance termination stage with impedance matching, in accordance with an example embodiment of the disclosure.

FIG. 5 illustrates an example power amplifier architecture having a low input voltage and low impedance termination stage with impedance matching, in accordance with an example embodiment of the disclosure. FIG. 5 shows a similar modification to the circuit of FIG. 3 (e.g., similar to the modification shown by FIG. 4), where a feedback path comprising $R_{FB}$ and $C_{FB}$ has been added for impedance matching. As with the circuit in FIG. 4, the output impedance may be matched with a receiving load circuit without an additional parallel load resistor, decreasing the DC current by half.

In an embodiment of the disclosure, a method and system may comprise an output stage for an electrical circuit, the output stage comprising a pair of input cascode transistors and at least one pair of stacked output transistors. A source-follower feedback path for the input cascode transistors may comprise a feedback transistor with its gate terminal coupled to a drain terminal of a first of the input cascode transistors, a drain of the feedback transistor coupled to a supply voltage, and a source terminal of the feedback transistor coupled to a current source that is coupled to ground.

A current source may be coupled to the drain of the first of the input cascode transistors. The supply voltage may be coupled to the at least one pair of stacked output transistors via a load resistor. The input cascode transistors, the feedback transistor, and the at least one pair of stacked output transistors may comprise complementary metal-oxide semiconductor (CMOS) transistors. A current through the input cascode transistors may be controlled by a bias voltage applied to a gate terminal of the first of the input cascode transistors.

The electrical circuit may comprise a power amplifier. The power amplifier may comprise a differential gain stage coupled to a source terminal of the first of the cascode transistors and a drain of a second of the cascode transistors. The electrical circuit may comprise a digital-to-analog converter (DAC) that may comprise a plurality of unit cells, each cell coupled to a source terminal of the first of the cascode transistors and a drain of a second of the cascode transistors. Each of the plurality of unit cells may also be coupled to cascode transistors in a second output stage nominally identical to the output stage. A feedback circuit comprising a resistor and capacitor in series may be coupled from the pair of input cascode transistors to a load resistance that is coupled to the at least one pair of stacked output transistors.

Other embodiments may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for low input voltage low impedance termination stage for current inputs.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device, the device comprising:
an output stage for an electrical circuit, the output stage comprising a pair of input cascode transistors and at least one pair of stacked output transistors, wherein a source-follower feedback path for the input cascode transistors comprises a feedback transistor with its gate terminal coupled to a drain terminal of a first of the input cascode transistors, a drain of the feedback transistor coupled to a supply voltage, and a source terminal of the feedback transistor coupled to a current source that is coupled to ground.

2. The semiconductor device according to claim 1, wherein a current source is coupled to the drain of the first of the input cascode transistors.

3. The semiconductor device according to claim 1, wherein the supply voltage is coupled to the at least one pair of stacked output transistors via a load resistor.

4. The semiconductor device according to claim 1, wherein the input cascode transistors, the feedback transistor, and the at least one pair of stacked output transistors comprise complementary metal-oxide semiconductor (CMOS) transistors.

5. The semiconductor device according to claim 1, wherein a current through the input cascode transistors is controlled by a bias voltage applied to a gate terminal of the first of the input cascode transistors.

6. The semiconductor device according to claim 1, wherein the electrical circuit comprises a power amplifier.

7. The semiconductor device according to claim 6, wherein the power amplifier comprises a differential gain stage coupled to a source terminal of the first of the cascode transistors and a drain of a second of the cascode transistors.

8. The semiconductor device according to claim 1, wherein the electrical circuit comprises a digital-to-analog converter (DAC).

9. The semiconductor device according to claim 8, wherein the DAC comprises a plurality of unit cells, each cell coupled to a source terminal of the first of the cascode transistors and a drain of a second of the cascode transistors.

10. The semiconductor device according to claim 9, wherein each of the plurality of unit cells are also coupled to cascode transistors in a second output stage nominally identical to the output stage.

11. The semiconductor device according to claim 1, wherein a feedback circuit comprising a resistor and capacitor in series is coupled from the pair of input cascode transistors to a load resistance that is coupled to the at least one pair of stacked output transistors.

12. A method for communication, the method comprising:
in a semiconductor die, generating an output current that is proportion to an input signal, said output current generated by an output stage, the output stage comprising:
a pair of input cascode transistors and at least one pair of stacked output transistors; and
a source-follower feedback path for the input cascode transistors, said source-follower feedback path comprising:
a feedback transistor with its gate terminal coupled to a drain terminal of a first of the input cascode transistors;
a drain of the feedback transistor coupled to a supply voltage;
and a source terminal of the feedback transistor coupled to a current source that is coupled to ground.

13. The method according to claim 12, wherein a current source is coupled to the drain of the first of the input cascode transistors.

14. The method according to claim 12, wherein the supply voltage is coupled to the at least one pair of stacked output transistors via a load resistor.

15. The method according to claim 12, wherein the input cascode transistors, the feedback transistor, and the at least one pair of stacked output transistors comprise complementary metal-oxide semiconductor (CMOS) transistors.

16. The method according to claim 12, comprising controlling a current through the input cascode transistors with a bias voltage applied to a gate terminal of the first of the input cascode transistors.

17. The method according to claim 12, wherein the electrical circuit comprises a power amplifier.

18. The method according to claim 17, wherein the power amplifier comprises a differential gain stage coupled to a source terminal of the first of the cascode transistors and a drain of a second of the cascode transistors.

19. The method according to claim 12, wherein the electrical circuit comprises a digital-to-analog converter (DAC).

20. The method according to claim 19, wherein the DAC comprises a plurality of unit cells, each cell coupled to a source terminal of the first of the cascode transistors and a drain of a second of the cascode transistors and wherein each of the plurality of unit cells are also coupled to cascode transistors in a second output stage nominally identical to the output stage.

21. The method according to claim 12, wherein a feedback circuit comprising a resistor and capacitor in series is coupled from the pair of input cascode transistors to a load resistance that is coupled to the at least one pair of stacked output transistors.

22. A semiconductor device comprising:
a pair of output stages for a digital-to-analog converter (DAC), the output stages each comprising:
a pair of input cascode transistors;
at least one pair of stacked output transistors;
a feedback path comprising a resistor and capacitor in series coupled from the pair of input cascode transistors to a load resistance that is coupled to the at least one pair of stacked output transistors; and
a source-follower feedback path for the input cascode transistors, said source-follower feedback path comprising:
a feedback transistor with its gate terminal coupled to a drain terminal of a first of the input cascode transistors;

a drain of the feedback transistor coupled to a supply voltage;
and a source terminal of the feedback transistor coupled to a current source that is coupled to ground.

* * * * *